(12) United States Patent
Okubo et al.

(10) Patent No.: US 6,753,728 B2
(45) Date of Patent: Jun. 22, 2004

(54) DISTORTION REDUCING CIRCUIT

(75) Inventors: Yoichi Okubo, Tokyo (JP); Kiyoshi Funada, Tokyo (JP); Masaki Suto, Tokyo (JP); Masato Horaguchi, Tokyo (JP); Toshio Takada, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 34 days.

(21) Appl. No.: 10/153,630

(22) Filed: May 24, 2002

(65) Prior Publication Data

US 2003/0085761 A1 May 8, 2003

(30) Foreign Application Priority Data

Jun. 11, 2001 (JP) .................................... 2001-175647

(51) Int. Cl.⁷ ................................................. H03F 1/26
(52) U.S. Cl. ...................................... 330/149; 330/302
(58) Field of Search .................................. 330/149, 296, 330/297, 302, 306

(56) References Cited

U.S. PATENT DOCUMENTS

| | | | | | |
|---|---|---|---|---|---|
| 5,347,389 | A | * | 9/1994 | Skrobko | 330/308 |
| 5,706,010 | A | * | 1/1998 | Franke | 342/47 |
| 6,166,599 | A | * | 12/2000 | Aparin et al. | 330/149 |
| 2001/0013809 | A1 | * | 8/2001 | Fujiwara et al. | 330/149 |

* cited by examiner

*Primary Examiner*—Khanh Van Nguyen
(74) *Attorney, Agent, or Firm*—Bacon & Thomas, PLLC

(57) ABSTRACT

A distortion reducing circuit compensates an upper side third-order distortion and a lower side third-order distortion produced by an amplifier for amplifying a fundamental signal including multiple frequency components. The distortion reducing circuit includes a second harmonic reflection coefficient regulation circuit, installed at an output side of the amplifier, for regulating reflection coefficients for multiple frequency components included in a second harmonic signal to have a constant value.

3 Claims, 13 Drawing Sheets

FEED FORWORD

PRE-DISTORTION

DISTORTION REDUCING CIRCUIT

FIELD OF THE INVENTION

The present invention relates to a distortion compensation apparatus; and, more particularly, to a distortion compensation apparatus capable of effectively canceling out upper and lower side third-order distortions produced by an amplifier.

BACKGROUND OF THE INVENTION

Distortions are produced when baseband signals having multiple frequency components, e.g., a WCDMA (Wide-Band Code Division Multiple Access) signal, a multi-carrier signal and the like are amplified by an amplifier in a communications system for amplifying a communications signal; and such distortions need to be compensated. Conventionally, in order to amplify these signals while suppressing distortions, a sufficiently large backoff is set in the amplifier or a distortion compensation process by way of a feed forward scheme or a pre-distortion scheme is carried out.

Referring to FIG. 6, there is illustrated a block diagram of a conventional amplification apparatus including a distortion compensation circuit employing the feed forward scheme.

In the amplification apparatus shown in FIG. 6, an input signal (a main signal) is divided into a primary signal and a subsidiary signal by a divider 1. The primary signal is amplified by a main amplifier 2 and transferred to a subtractor 4. The subsidiary signal is provided to the subtractor 4 through a delay line 3. The subtactor 4 subtracts the subsidiary signal inputted through the delay line 3 from a portion of the amplified primary signal inputted from the main amplifier 2 to extract distortion components. The extracted distortion components are fed to a distortion amplifier 5 and the amplified primary signal with distortions is transferred into a subtractor 7 through a delay line 6. The distortion components fed into the distortion amplifier 5 are amplified by the distortion amplifier 5 and then provided to the subtractor 7. The subtractor 7 subtracts the amplified distortion component provided from the distortion amplifier 5 from the amplified primary signal provided through the delay line 6, thereby outputting an amplified and compensated signal without distortion.

The signal inputted into the subtractor 7 through the delay line 6 includes distortions produced by the main amplifier 2 and the amplified distortion components inputted into the subtractor 7 from the distortion amplifier 5 corresponds to the distortions produced by the main amplifier 2. Therefore, the output signal of the subtractor 7 corresponds to a signal in which the distortions produced by the main amplifier 2 are removed from the primary signal amplified by the main amplifier 2. The divider 1 and the subtractors 4 and 7 are respectively implemented by, e.g., directional couplers.

Referring to FIG. 7, there is provided a block diagram of a conventional amplification apparatus including a distortion compensation circuit employing the pre-distortion scheme.

In the amplification apparatus shown in FIG. 7, a pre-distortion circuit 11 is installed at a front stage of a main amplifier 12. The pre-distortion circuit 11 introduces in advance pre-distortions having same amplitudes but differing in phase by 180 degrees (i.e., being in opposite phases) compared with actual distortions to be produced in the main signal by the main amplifier 12. Subsequently, the pre-distortion circuit 11 outputs the main signal containing the pre-distortions. The actual distortions produced by the main amplifier 12 and the pre-distortions introduced by the pre-distortion circuit 11 are cancelled out.

In such amplification apparatus, the pre-distortions introduced by the pre-distortion circuit 11 and the actual distortions produced by the main amplifier 12 should be wholly matched to each other in relation to the input variation of the main signal and frequency characteristics of distortions. The distortions produced in the amplified signal are caused by AM (Amplitude Modulation)-AM conversion and AM-PM (Phase Modulation) conversion.

The gain and phase characteristics of the pre-distortion circuit should be set to be ideal with respect to those of the amplifier. Since, however, the characteristics of AM-AM and AM-PM conversions are very complicated, the characteristics of such an ideal pre-distortion circuit only can be expressed by a complicated function, rendering it virtually impossible to analytically or computationally obtain the coefficients of characteristics curve.

Thus, an alternative amplification apparatus including a distortion compensation circuit employing the pre-distortion scheme has been contemplated as shown in FIG. 8.

In the amplification apparatus shown in FIG. 8, an input signal, e.g., an RF (Radio Frequency) signal, is divided into a primary signal and a subsidiary signal by a divider 21, wherein the primary signal is transferred to an amplitude/phase circuit 27 via a delay circuit 22 and the subsidiary signal is fed to an amplitude detector (envelope detector) 23.

The amplitude detector 23 detects an amplitude level (envelope level) of the subsidiary signal. The detection result of an analog signal is converted into a digital signal by an A/D (Analog to Digital) converter 24 and then provided to a table section 25.

In the table section 25, amplitude correction data and phase correction data are stored as a table for various amplitude levels in a memory (not shown) of the table section 25. The amplitude correction data and the phase correction data in the table corresponding to the detection result of the amplitude level inputted from the A/D converter 24 are read and loaded to a D/A converter 26. In the D/A converter 26, the amplitude correction data and the phase correction data loaded from the table section 25 are converted from a digital signal into an analog signal and provided to the amplitude/phase circuit 27.

The primary signal outputted from the divider 21 is delayed by the delay circuit 22 such that the input timing of the delayed primary signal to the amplitude/phase circuit 27 is synchronized with that of the amplitude correction data and the phase correction data from the D/A converter 26.

By means of such delay, amplitude distortion is produced based on the amplitude correction data corresponding to the amplitude level of the subsidiary signal and then introduced into the primary signal at the amplitude/phase circuit 27. At the same time, phase distortion is generated in response to the phase correction data corresponding to the amplitude level of the subsidiary signal and then added to the primary signal at the amplitude/phase circuit 27. Herein, the amplitude distortion and the phase distortion are provided by the amplitude/phase circuit 27 such that they can cancel out actual amplitude and phase distortions to be produced by a main amplifier 28.

That is, the table section 25 stores such amplitude and phase correction data that have been provided in consideration of the characteristics of the main amplifier 28 in terms of the AM-AM and AM-PM conversion thereof as a function of input level. Therefore, the amplitude/phase circuit 27 can produce, in response to the amplitude and phase correction data provided from the D/A converter 26, the predistorted primary signal having opposite characteristics to those to be produced by the main amplifier 28. As a result, ideal distortionless amplification can be realized over the whole amplification apparatus.

In other words, an output signal of the amplitude/phase circuit 27 is amplified by the main amplifier 28, and the actual amplitude distortion and the actual phase distortion produced by the main amplifier 28 are canceled out by the amplitude distortion and the phase distortion introduced by the amplitude/phase circuit 27. Consequently, an amplified signal without distortion is outputted from the main amplifier 28 via a divider 29.

The divider 29 divides the amplified signal inputted from the main amplifier 28 and dispatches a portion of the amplified signal to a distortion detection section 30.

The distortion detection section 30 detects distortion components left after compensation in the sample of the amplified signal provided from the divider 29 and feeds the detection result to a table updating circuit 31.

The table updating circuit 31 responsive to the detection result inputted from the distortion detection section 30 computes amplitude correction data and phase correction data, which can, e.g., minimize the distortion components remaining in the sample of the amplified signal obtained from the divider 29 and outputs the computation result to the table section 25 to overwrite the amplitude correction data and the phase correction data stored in the table section 25 with the best values.

By employing such an updating process of the amplitude correction data and the phase correction data performed by using the feedback scheme, an amplification apparatus can be effectively operated without being affected by the temperature variation or the aging effect.

However, there still remains a problem to be addressed in that distortion characteristics of an amplifier in general has a frequency-dependence.

FIG. 9 presents frequency spectrum of two main signals and corresponding distortion outputted from an amplifier in case where a main signal of a frequency f1 and another main signal of a frequency f2 are amplified by the amplifier. The abscissa represents frequency and the ordinate represents an intensity level of a signal. The distortion of the frequency spectrum shown in FIG. 9 corresponds to intermodulation (IM) distortion components including a lower side third-order distortion of frequency 2·f1−f2 and an upper side third-order distortion of frequency 2·f2−f1. Herein, the larger the numeral located immediately after "f" is, the higher the frequency is (i.e. f2>f1).

As shown in FIG. 9, even when intensity levels of two main signals are identical to each other, there may occur a difference of ΔIM(=A−B) between an intensity level B of the lower side third-order distortion of frequency 2·f1−f2 and an intensity level A of the upper side third-order distortion of frequency 2·f2−f1. The distortion compensation is evenly carried out throughout the whole frequency band. Therefore, if such ΔIM occurs, components of the difference ΔIM cannot be compensated and are left in the amplified signal after distortion compensation, even in the case where the pre-distortion circuit of the amplification apparatus shown in FIGS. 7 and 8 ideally operates.

Such difference ΔIM may originate from processes other than a typical distortion generation mechanism of an amplifier. The intensity levels of the third-order distortion components typically produced by an amplifier are equal to each other at the lower side frequency 2·f1−f2 and the upper side frequency 2·f2−f1.

Several factors can be considered as the source of the described difference ΔIM. It may be contemplated as one of the factors that distortion of a difference frequency f2−f1 originates from an even-order distortion caused by a transistor included in a main amplifier and the input signals of frequencies f1 and f2 are modulated by the distortion produced by the transistor, which is noticeable in case that a change of a drain current is large as in a class AB amplifier.

Alternatively, it may also be possible that frequencies of output components of such second harmonics as a frequency 2·f1 and a frequency 2·f2 are mixed with the frequencies of f1 and f2.

Distortion compensation problems which can take place due to the presence of the ΔIM will now be described in detail hereinafter.

FIGS. 10A and 10B show schematic graphs for illustrating exemplary frequency spectra of the upper side third-order distortion and the lower side third-order distortion produced when a signal including frequency components f1, f2, . . . , fn (n being an integer larger than 2) is amplified by an amplifier, wherein a level of third-order distortion shown in FIG. 10A is higher than that of third-order distortion shown in FIG. 10B by X. The abscissa represents frequency and the ordinate represents a level of a signal.

In FIGS. 10A and 10B, a required level of the third-order distortion components remaining after distortion compensation is represented by dashed lines and it is required that the third-order distortion components are to be reduced below the required level by the distortion compensation. For example, in the feed forward scheme for extracting distortion from a signal amplified by a main amplifier and then canceling out the distortion based thereon from the corresponding amplified signal, if the amount of distortion cancellation is sufficiently large, e.g., greater than "y" shown in FIG. 10A, all the third-order distortion components shown in FIGS. 10A and 10B can be decreased below the required level. However, if the amount of distortion cancellation is "z", the third-order distortion components shown in FIG. 10A are left in the amplified signal by the amount of "x". It can be seen from the above that in the feed forward scheme a lower level distortion component among the upper and lower side third-order distortions produced by an amplifier can be more readily compensated than a higher level distortion component thereamong and therefore the degree of precision of the distortion compensation can be improved for the lower level distortion component.

Meanwhile, in order to perform distortion compensation in high degree of precision through the use of the pre-distortion scheme, in which a predetermined distortion is introduced in advance to cancel out third-order distortion components to be produced by a main amplifier, it is needed to adjust the amplitude and phase of the pre-distortion by considering whether the third-order distortion is produced as shown in FIG. 10A or FIG. 10B.

Referring to FIGS. 11A and 11B, the above will be explained in further detail.

FIG. 11A shows a vector plot describing the distortion compensation process by the feed forward scheme. Assuming that the amount of distortion cancellation can be adaptively adjusted and the third-order distortion produced by an amplifier is represented as a vector "−a", the third-order distortion can be canceled out in its entirety by deliberately introducing a distortion as a vector "a" having characteristics opposite to those of the third-order distortion represented produced by the amplifier, as shown in case (1) of FIG. 11A. Similarly, when the third-order distortion produced by the amplifier is represented as a vector "−a−b", the entire third-order distortion can be canceled out by deliberately introducing the distortion represented as a vector "a+b" having characteristics opposite to those of the third-order distortion produced by the amplifier, as shown in case (2) of FIG. 11A.

FIG. 11B shows a vector plot in case of performing the distortion compensation by the pre-distortion scheme. Assuming that the amount of pre-distortion is fixed and represented as a vector "a" and the third-order distortion produced by an amplifier is represented as a vector "−a", the totality of the third-order distortion can be canceled out as shown in case (1) of FIG. 11B. However, when the third-order distortion produced by the amplifier is represented as a vector "−a−b", the third-order distortion component in the amount represented as a vector "−b" remains left behind as shown in case (2) of FIG. 11B.

Referring to FIG. 12, there is illustrated a graph for illustrating distortion characteristics of an amplifier in terms of the intensity levels of the third-order distortion components as a function of the difference frequency $\Delta f=(f2-f1)$ between two input signals of frequencies f1 and f2, wherein the curves W1 and W2 represent the characteristics of the upper and the lower side third-order distortion components, respectively. The abscissa represents the difference frequency $\Delta f$ and the ordinate represents the level of a signal.

As shown in FIG. 12, there occurs an offset between levels of the upper side third-order distortion component and the lower side third-order distortion component. Also, if the frequencies f1 and f2 of two input signals are changed or the difference frequency $\Delta f$ therebetween is varied, the levels of the upper and the lower side third-order distortion components are also changed.

In case of the distortion compensation process by the feed forward scheme, therefore, if the levels of the upper and the lower side third-order distortion components produced by an amplifier under the worst case become very large, the amount of distortion compensation required for reducing the corresponding third-order distortion components down to the predetermined distortion level (required level) also becomes large, accordingly, imposing a heavy processing burden. In principle, however, if a sufficient amount of distortion cancellation can be obtained, it is possible in the feed forward scheme to compensate distortions even if there occurs a certain unbalance in the levels of the upper side and the lower side third-order distortion components.

On the other hand, in the distortion compensation by the pre-distortion scheme introducing predetermined distortion in advance, there may occur, in addition to the problems described above, a further problem that the required amount of the distortion cancellation may not be obtained if the frequency of the signal component included in a signal amplified by an amplifier deviates from the predetermined frequency.

Referring to FIG. 13A, there is illustrated an exemplary graph for illustrating output signals from an amplifier including two signals of frequencies at fi and fj (j>i) and third-order distortion components thereof at frequencies of 2·fj−fi and 2·fi−fj, i and j being 1 to n. For the convenience of explanation, it is assumed that the two signals whose frequencies are f1 and f2, respectively, and the third-order distortion components thereof respectively have same levels. "IM" refers to the difference between the level of two signals and that of the third-order distortion components. In FIG. 13A, the abscissa represents a frequency and the ordinate represents a level of a signal.

In such a case, a typical characteristic of "IM" as a function of the difference frequency $\Delta f(=fj-fi)$ is represented as in a curve Q1 of the solid line, as shown in FIG. 13B. However, considering the realization of distortion compensation in high degree of precision, it is preferable that the IM is constant as represented in a straight line Q2 of the dashed line. In FIG. 13B, the abscissa represents the difference frequency $\Delta f$ between two signals and the ordinate represents a level of "IM".

Some of the prior art references relevant to the present invention will now be described below.

The exemplary prior art references to be described below are configured such that second harmonics are shorted at an output side of a transistor for the purpose of achieving an enhanced efficiency of the transistor itself by improving an F class operation, which differs from the distortion compensation apparatus of the present invention in terms of objects and overall configurations.

For example, a high output amplifier disclosed in Japanese Patent Laid-Open Publication No. 2000-77957 (a document 1) is shown in FIG. 14, which is configured of a Field Effect Transistor (FET) T11. At an output side of the transistor T11, a fundamental frequency matching is carried out at a fundamental frequency matching circuit M11. A second harmonic signal is shorted by a short stub B1 whose line length is ¼ of the wavelength of the fundamental frequency, so that an impedance (phase) for the second harmonic signal can be independently set by a transmission line S11. A third harmonic signal is shorted by an open stub B2, so that an impedance (phase) for the third harmonic signal can be independently set by a transmission line S12.

Further, a high output amplifier disclosed in Japanese Patent Laid-Open Publication No. 1999-220343 (a document 2) is shown in FIG. 15, which is configured of an FET T12. At an output of the transistor T12, a fundamental frequency matching is carried out by a fundamental frequency matching circuit M12. A second harmonic signal is shorted by a second harmonic signal resonance circuit including an inductor L12 and a capacitor C11 and a second harmonic signal processing circuit having a short stub B3 and a capacitor C12, wherein a line length of the short stub B3 is ¼ of the wavelength of the fundamental frequency. Further, as shown in drawing, a lead inductor L11, a coil (a choke coil) L13 and a DC blocking capacitor C13 are also installed at this circuit. An input matching circuit (not shown) is provided at an input side of the transistor T12.

Further, a high frequency amplifier disclosed in Japanese Patent Laid-Open Publication No. 1999-234062 (a document 3) is shown in FIG. 16, which is configured of a transistor T13. At an output side of the transistor T13, a fundamental frequency matching is carried out by a fundamental frequency matching circuit M13. A second harmonic signal is shorted by a transmission line S13 of a line length of ¼ of the wavelength of the fundamental frequency and a capacitor C14.

Further, a power amplifier disclosed in Japanese Patent Laid-Open Publication No. 1997-36670 (a document 4) is configured of a power amplifier capable of facilitating the suppression of nonlinear distortion and the reduction of power consumption, but a second harmonic is not described therein.

As described above in the prior distortion compensation apparatus employing, for example, the feed forward scheme or the pre-distortion scheme, sufficient amount of distortion cancellation may not be obtained in case of amplifying a signal having multiple frequency components by an amplifier, because the levels of the upper and the lower side third-order distortion components may be increased due to the second harmonics of the corresponding signal or changed depending on the frequency variations of the signal components included in the corresponding signal and also by the variation of the difference frequency thereof.

SUMMARY OF THE INVENTION

It is, therefore, a primary object of the present invention to provide a distortion compensation apparatus capable of increasing the amount of distortion cancellation in terms of compensating the upper side third-order distortion and the lower side third-order distortion produced by an amplifier for amplifying a signal including multiple frequency components.

It is another object of the present invention to provide a distortion compensation apparatus capable of regulating the levels of the upper and the lower side third-order distortions to be identical from one another to thereby effectively carry out the distortion compensation by, e.g., the pre-distortion scheme.

It is still another object of the present invention to provide a distortion compensation apparatus capable of scaling down the levels of the upper side and the lower side third-order distortions produced by an amplifier to thereby effectively carry out the distortion compensation by, e.g., the feed forward scheme and the pre-distortion scheme.

In accordance with a preferred embodiment of the present invention, there is provided a distortion reducing circuit, including:

means for compensating an upper side third-order distortion and a lower side third-order distortion produced by an amplifier for amplifying a fundamental signal having multiple frequency components; and a second harmonic reflection coefficient regulation circuit, installed at an output side of the amplifier, for regulating reflection coefficients for multiple frequency components included in a second harmonic signal to have a constant value.

A distortion reducing circuit, for suppressing the upper and the lower side distortions produced by an amplifier for amplifying a fundamental signal including multiple frequency components, in accordance with the present invention includes, at the output side of the amplifier, a second harmonic reflection coefficient regulation circuit capable of regulating reflection coefficients of various frequency components included in a second harmonic signal at a constant value.

The second harmonic reflection coefficient regulation circuit regulates amplitudes and phases of the components in the second harmonic signal, by reflection after being outputted therefrom, to be constant to be fed back into the amplifier independent of the frequencies of the components. Therefore, the levels of the upper and the lower side third-order distortions produced by the amplifier can be made to be substantially identical with each other irrespective of their frequencies, and accordingly, distortion compensation can be carried out effectively by, for example, the pre-distortion scheme.

That is, in case where an input signal (a fundamental signal) into an amplifier includes multiple frequency components (including continuous bands), a second harmonic signal of the input signal also includes multiple frequency components. Reflection coefficients of the frequency components of the second harmonic signal generally differ from each other depending on their frequencies. Since, however, the present invention regulates reflection coefficients to be substantially same for the whole frequency components included in the second harmonic signal, the upper and the lower side third-order distortions originated from reflected frequency of the second harmonic signal can be regulated to have a constant intensity level, independent of their frequencies. Thus, the distortion compensation by the pre-distortion scheme, which introduces pre-distortion components having same amplitudes and phases to be produced throughout the whole frequency range to cancel out the distortions to be produced by an amplifier, can be effectively carried out by employing the present invention. Though, in this configuration, the upper side and the lower side third-order distortion components originating from the second harmonic signal may not be reduced to zero, but the unbalance between the upper side and the lower side third-order distortion components can be removed.

In a preferred distortion reducing circuit in accordance with the present invention, the second harmonic reflection coefficient regulation circuit is implemented by a second harmonic matching circuit, which produces zero valued reflection coefficients for the multiple frequency components included in the second harmonic signal.

Therefore, the amplitudes of the frequency components in the second harmonic signal, which is outputted from an amplifier and then fed back thereto by reflection, are reduced to zero for all the frequency components by the second harmonic reflection coefficient regulation circuit. Resultantly, the levels of the upper and the lower side third-order distortions are scaled down compared to the prior art, regardless of frequencies. Accordingly, improved distortion cancellation can be achieved by the feed forward scheme and the pre-distortion scheme.

In other words, matching of the whole frequency components included in the second harmonic signal produced by the amplifier is carried out in accordance with the present invention to thereby prevent the second harmonic signal from being reflected back into the amplifier. Accordingly, the upper and the lower side third-order distortion components originating from the reflected components of the second harmonic signal can be avoided and therefore a total amount of the third-order distortions produced by the amplifier can be decreased that much in comparison with the prior art. Thus, the amount of distortion to be compensated (required amount of the distortion cancellation) in the distortion compensation process by the feed forward scheme or the pre-distortion scheme can be reduced accordingly and a burden for the distortion compensation process can also be decreased. Further, by removing or reducing the upper side and the lower side third-order distortion originating from the reflected components of the second harmonic signal, the unbalance between the upper side third-order distortion and the lower side third-order distortion can also be removed or reduced. Consequently, ideal distortion compensation by, e.g., the pre-distortion scheme, can be performed over the whole band of the input signal (the fundamental signal) and the high precision distortion compensation can be realized.

In an alternative, the distortion reducing circuit in accordance with the present invention, the second harmonic reflection coefficient regulation circuit is implemented by a second harmonic short circuit, which regulates the reflection coefficients for the multiple frequency components included in the second harmonic signal to be a constant value of −1.

Such configuration using the second harmonic short circuit is advantageous in that it can be readily realized.

Further, in a preferred distortion reducing circuit in accordance with the present invention, an amplifier is configured by using an internal matching type transistor. A corresponding distortion reducing circuit is implemented by installing a transistor chip and a second harmonic short circuit in a transistor case.

Such configuration using the internal matching type transistor is advantageous in that a compact device can be realized with improved efficiency.

The distortion reducing circuit described above in accordance with the present invention may be used with a pre-distortion circuit or a feed forward distortion circuit in order to compensate the upper and the lower side third-order distortions produced by an amplifier.

As described above, the present invention regulates the reflection coefficients of the frequency components in the second harmonic signal fed back to the amplifier to be constant independent of their frequencies, thereby removing or reducing level shifts of the upper and the lower side third-order distortion components originating from the second harmonic signal in the amplifier and lowering the corresponding levels. Thus, compensation precision of the third-order distortion components can be enhanced.

A fundamental signal including multiple frequency components may not be of any specific type and also the number of the frequency components included in the fundamental signal need not be any specific number either, as long as it is not less than 1. In addition, the frequency components included in the fundamental signal may have discrete frequencies or continuous frequencies of certain bandwidth.

Any kinds of amplifiers can be used as an amplifier of the present invention. For instance, a group of amplifiers as well as a combination of a plurality of amplifiers can be used therefor. An amplifier for amplifying a signal including multiple frequency components is referred to as a common amplifier.

Various transistors, for example, an FET, may be used as a transistor of the amplifier of the present invention.

Assuming that frequency components included in the fundamental signal respectively have frequencies f1 and f2, the upper and the lower side third-order distortions produced by an amplifier respectively represent distortions at frequencies 2·f2−f1 and 2·f1−f2. Similarly, in case where the fundamental signal includes more than two frequency components, there occur an upper and a lower side third-order distortion per each pair of two different frequency components.

In general, due to third-order distortion components originating from a second harmonic signal in an amplifier, both a total amount of intensity levels of the upper side third-order distortions and that of the lower side third-order distortions are increased and at the same time there occurs the difference (unbalance) therebetween.

A second harmonic signal is a signal including frequency components, the frequency of each component being twice fundamental frequency included in the fundamental signal. For example, for a fundamental signal including signals whose frequencies are f1 and f2, signals having frequencies 2·f1 and 2·f2 are outputted from an output terminal of the amplifier as a second harmonic signal.

Further, it is preferable that reflection coefficients for the whole frequency components included in the second harmonic signal are identical to each other. However, the reflection coefficients may differ from each other by a certain degree acceptable in practical application and such case is also encompassed by the scope of the present invention.

The second harmonic reflection coefficient regulation circuit may be implemented by various circuits. For example, a circuit having a fixed resistance, capacitance and inductance or a circuit adaptively controllable those values can be employed.

It is preferable that the compensation precision of the third-order distortion components produced by an amplifier can reduce such third-order distortions down to zero. However, a certain amount of distortions may be left behind after distortion compensation as long as it is acceptable in practical application.

It is preferable to have, together with the second harmonic reflection coefficient regulation circuit described above, a matching circuit of a fundamental signal at the output side of the amplifier. It is also preferable to have a matching circuit for a fundamental signal and a matching circuit for a second harmonic signal at an input side of the amplifier.

The reflection coefficient can be defined as: "a reflection coefficient=(a voltage of a reflected wave fed back from a load)/(a voltage of a traveling wave progressing to the load)". The absolute value of the reflection coefficient, i.e., |reflection coefficient|, is smaller than or equal to 1 (|a reflection coefficient|≦1). The zero valued reflection coefficient represents that all traveling waves are absorbed by the load without being fed back therefrom. In other words, when reflection coefficient is zero, the traveling waves are not reflected at all, representing a matching state. A reflection coefficient of a value of −1 represents a shorted total reflection state and a reflection coefficient of a value of +1 represents an open reflection state. A reflection coefficient of |1| represents a reflection state accompanying a phase shift. Further, 0≦|a reflection coefficient|≦1 represents a mismatching state where a part of the traveling waves is absorbed by the load and the remaining part thereof is fed back to the amplifier, while |a reflection coefficient| of 1 represents that a reflected wave having a same amplitude (absolute value) as that of a traveling wave is fed back from a load.

FIG. 5A represents an exemplary circuit diagram for carrying out the matching of a second harmonic signal. In this circuit, a traveling wave of the second harmonic signal outputted from a transistor Ta is absorbed by a load through a matching circuit P and a resistor R, to thereby prevent the generation of a reflected wave of the corresponding second harmonic signal.

FIG. 5B represents an exemplary circuit diagram for illustrating a total reflection of a second harmonic signal. Tn this circuit, a traveling wave of the second harmonic signal outputted from a transistor Tb is totally reflected by a second harmonic short circuit including an inductor L and a capacitor C and then fed back to the transistor Tb. The total reflection of wave can also be accomplished by replacing the second harmonic short circuit including the inductor L and the capacitor C with a circuit including shorted transmission lines, each having a length corresponding to a half wavelength of a second harmonic wave.

A principle of the present invention will now be explained below. For the convenience of explanation, it is assumed that a fundamental signal includes two frequency components in the description below. However, the same will hold in a case where more than two frequency components are included in a fundamental signal.

For example, assuming that a distortion characteristic V0 of a transistor (amplifier) is represented by Eq. (1) and that a frequency component $\{A_1 \cdot \cos(\omega_1 \cdot t)\}$ of an angular frequency $\omega_1$ corresponding to a frequency f1 and a frequency component $\{A_2 \cdot \cos(\omega_2 \cdot t)\}$ corresponding to a frequency f2 are inputted into a transistor as a fundamental signal Vin of an input signal, third-order distortion components X1 in case of without considering harmonics are represented by Eq. (2)

(see, e.g., "Harmonic Feedback Circuit Effects on Intermodulation Products and Adjacent Channel Leakage Power in HTB Power Amplifier for 1.95 GHz Wide-Band CDMA Cellular Phones", IEICE TRANS. ELECTRON., VOL. E82-C, NO. MAY 5, 1999 (a document 5)).

$$V0 = g1 \cdot Vin + g2 \cdot (Vin)^2 + g3 \cdot (Vin)^3 + \quad \text{Eq. (1)}$$

and $$X1 = (3/4) \cdot A1 \cdot (A2)^2 \cdot g3 \cdot \cos\{(2 \cdot \omega 2 - \omega 1) \cdot t\} + (3/4) \cdot (A1)^2 \cdot A2 \cdot g3 \cdot \cos\{(2 \cdot \omega 1 - \omega 2) \cdot t\} + \quad \text{Eq. (2)}$$

wherein g1, g2, g3, are respectively coefficients; A1 and A2 represent amplitudes and "t" represents time.

As can be see from Eq. (2), if the amplitudes A1 and A2 of two frequency components are identical with each other, the level (amplitude) of the upper side third-order distortion at frequency 2·f2−f1 corresponding to an angular frequency 2·ω2−ω1 and that of the lower side third-order distortion at frequency 2·f1−f2 corresponding to an angular frequency 2·ω1−ω2 become equal to one another regardless of the angular frequencies ω1 and ω2. The third-order distortion components represented in Eq. (2) are always produced in a typical transistor and no measure is taken in the present invention in order to directly reduce such third-order distortion components expressed in Eq. (2).

In case where a second harmonic signal of a fundamental signal is outputted by a transistor and a reflected second harmonic signal is fed back to the transistor with frequency components included in the fed-back second harmonic signal (a reflected wave signal) being represented by B1·cos(2·ω1·t+φ1) and B2·cos(2·ω2·t+φ2), the fed-back second harmonic signal is mixed with the fundamental signal and the third-order distortion components X2 represented by Eq. (3) are produced.

$$X2 = A1 \cdot B2 \cdot g2 \cdot \cos(2 \cdot \omega 2 \cdot t - \omega 1 t + \phi 2) + (3/4) \cdot A1 \cdot B1 \cdot B2 \cdot g3 \cdot$$
$$\cos(2 \cdot \omega 2 \cdot t - \omega 1 \cdot t + \phi 2 - \phi 1) + \ldots A2 \cdot B1 \cdot g2 \cdot \cos(2 \cdot \omega 1 \cdot t - \omega 2 \cdot t + \phi 1) + (3/4) \cdot$$
$$A2 \cdot B1 \cdot B2 \cdot g3 \cdot \cos(2 \cdot \omega 1 \cdot t - \omega 2 \cdot t + \phi 1 - \phi 2) + \quad \text{Eq. (3)}$$

wherein B1 and B2 are amplitudes of two frequency components included in the reflected second harmonic signal and φ1 and Φ2 represent phases of the angular frequency components thereof.

As for the third-order distortion components originating from the reflected portions of the second harmonic signal, the levels (amplitudes) and the phases of an upper side and a lower side third-order distortion component differ from one another if there exist the difference between the amplitudes B1 and B2 and that between phases φ1 and φ2, as represented in Eq. (3).

The overall third-order distortion components produced by a transistor are mainly composed of the sum of the third-order distortion components originating from the fundamental signal as represented in Eq. (2) and the third-order distortion components originating from the second harmonic signal as represented in Eq. (3).

A poor management of the reflection coefficients for the frequency components in a second harmonic signal as in the prior art normally results in nonuniform reflection coefficients. As a result, amplitudes B1 and B2 and phases φ1 and φ2 of the second harmonic frequency components become different from each other, yielding poor frequency characteristics and an unbalance between the upper side and the lower side third-order distortion. However, the distortion reducing circuit in accordance with the present invention can regulate the reflection coefficients for the whole frequency components included in the second harmonic signal to have a uniform value, so that the amplitudes B1 and B2 and the phases φ1 and φ2 of the frequency component can be controlled to respectively have same values and therefore the frequency characteristics can be improved. Implementation of a circuit for leveling the reflection coefficients of the multiple frequency components included in the second harmonic signal can be realized by, e.g., computer simulation.

In a prior art distortion compensation apparatus, frequency matching is carried out only for the frequencies in an amplification band of an amplifier, i.e., a band for the fundamental frequencies of an input signal. However, the distortion reducing circuit in accordance with the present invention performs the frequency matching not only in the amplification band of the amplifier but also in the whole frequency components included in the second harmonic signal. Thus, the level of the third-order distortion originating from the second harmonic signal represented in Eq. (3) can be reduced to zero. Accordingly, the third-order distortion components produced by a transistor can be mainly composed of components originating from the fundamental signal and thus the total amount of the third-order distortion components produced by the amplifier can be minimized due to the reduction of the third-order distortion components originating from the second harmonic signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In accordance with the present invention, a circuit capable of regulating reflection coefficients for multiple frequency components included in a second harmonic signal is installed at an output side of an amplifier. Preferred embodiments of the circuit in accordance with the present invention will be now described hereinafter.

Figure 6:
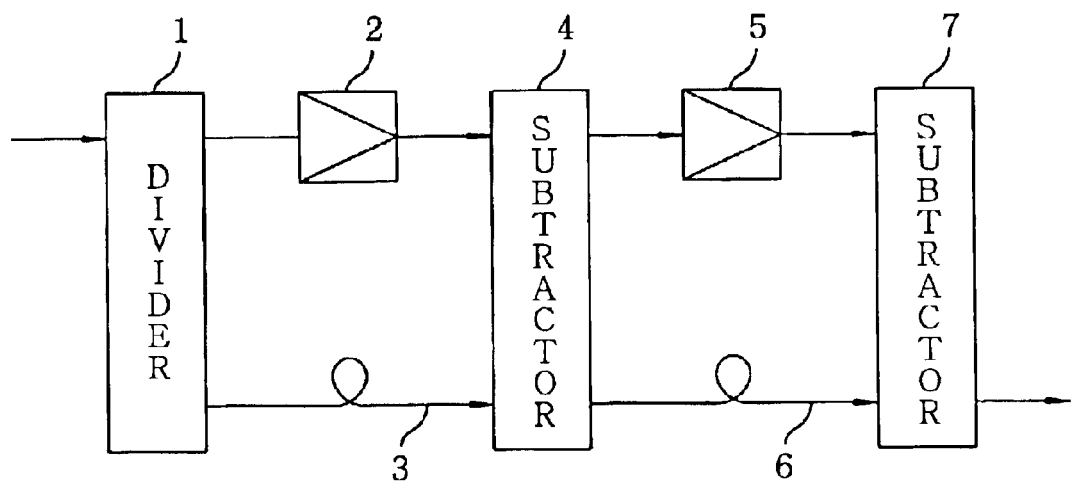
FIG. 6 offers a block diagram of a prior art amplification apparatus including a distortion compensation circuit employing a feed forward scheme.
Figure 7:
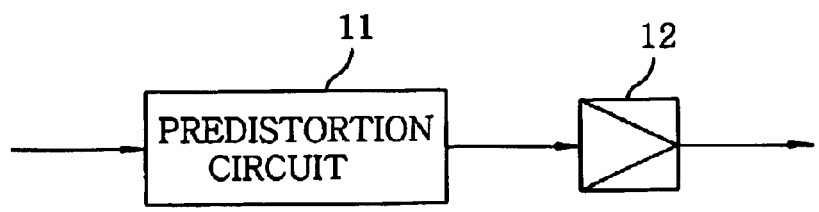
FIG. 7 provides a block diagram of a prior art amplification apparatus including a distortion compensation circuit employing a pre-distortion scheme.
Figure 8:
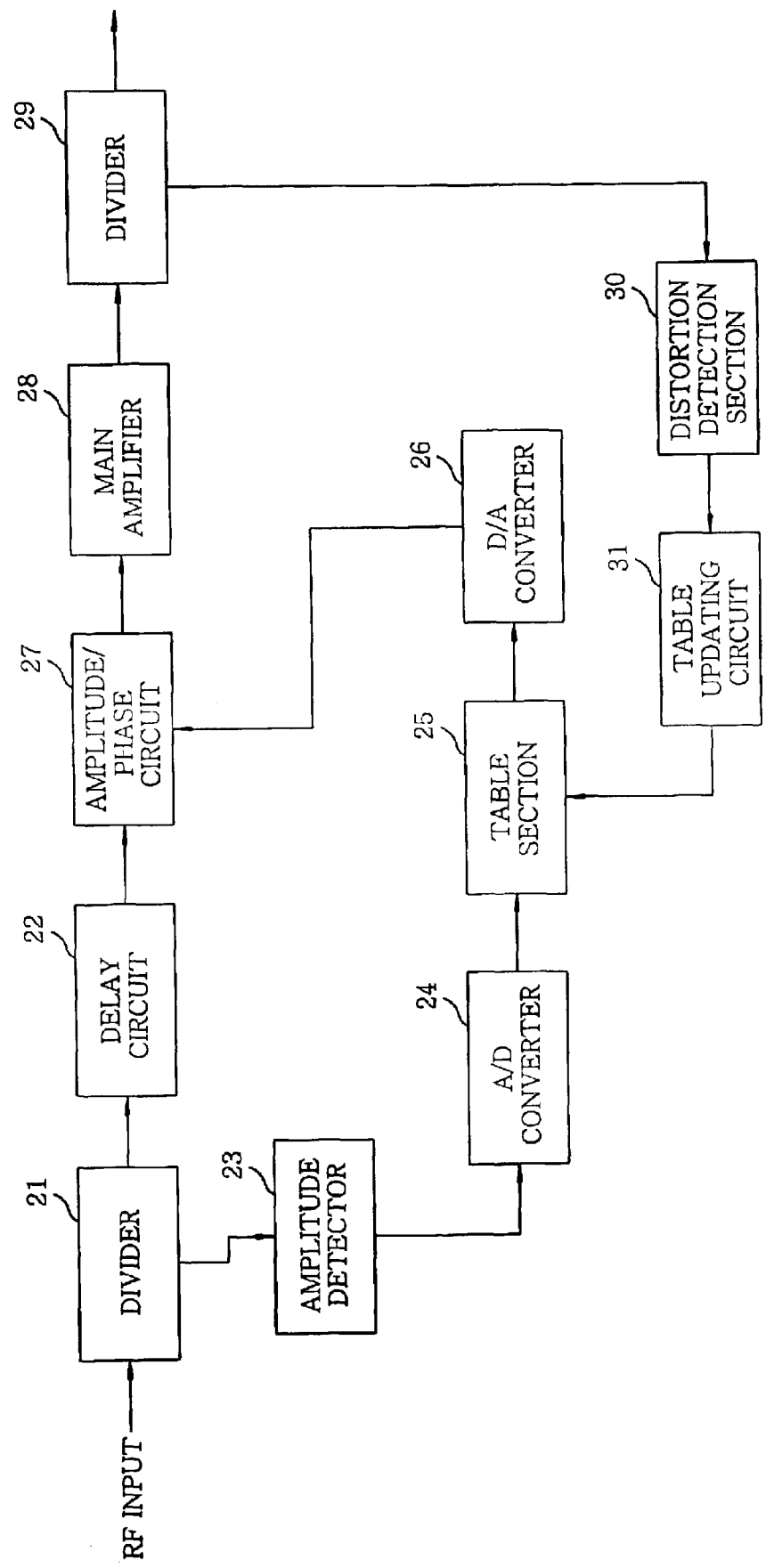
FIG. 8 shows a block diagram of a conventional amplification apparatus including another distortion compensation circuit employing a pre-distortion scheme.
Figure 9:
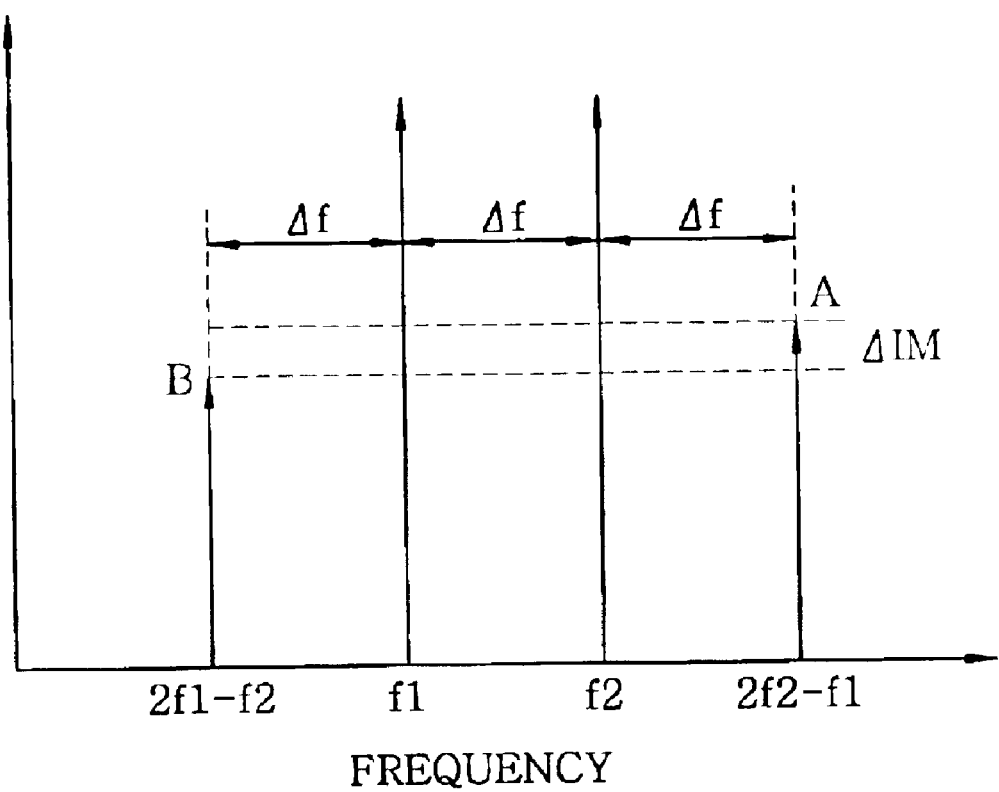
FIG. 9 exemplarily presents an upper side third-order distortion of frequency 2·f2−f1 and a lower side third-order distortion of frequencies 2·f131 f2 produced in case of amplifying a signal having frequencies f1 and f2 by an amplifier.
Figure 10A:
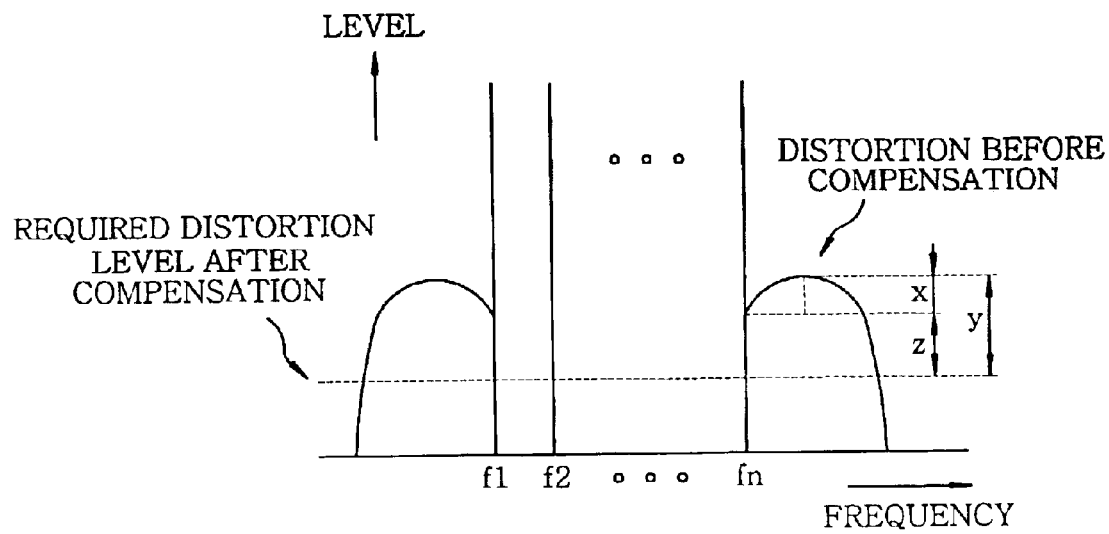
FIGS. 10A and 10B set forth a relationship between a required distortion level after distortion compensation and various distortion levels before distortion compensation.
Figure 10B:
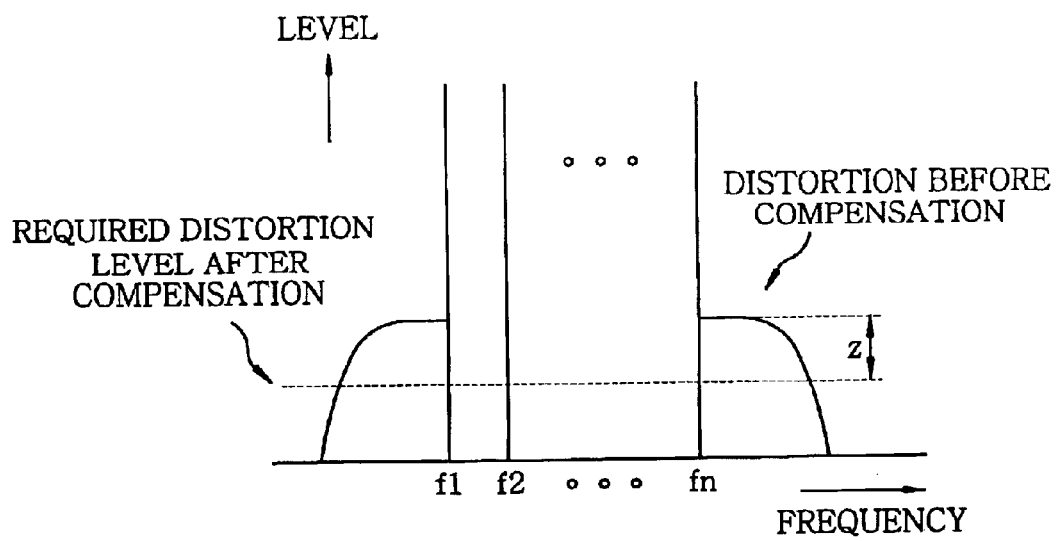
Figure 11A:
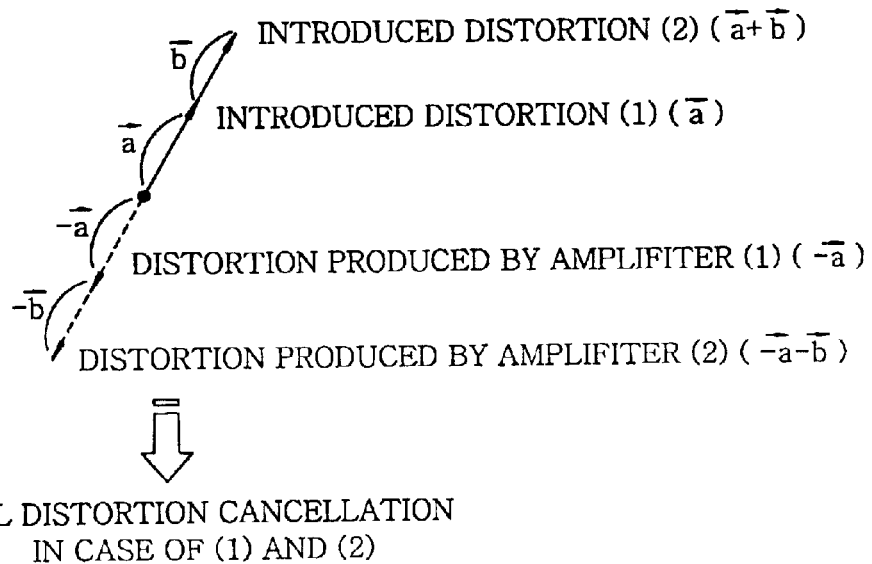
FIGS. 11A and 11B show vector plots for illustrating the distortion compensation processes carried out by the feed forward scheme and the pre-distortion scheme.
Figure 11B:
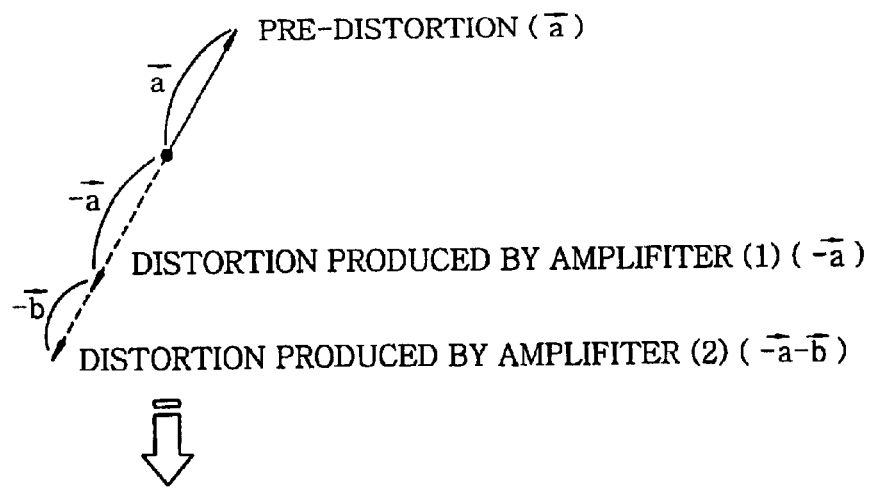
Figure 12:
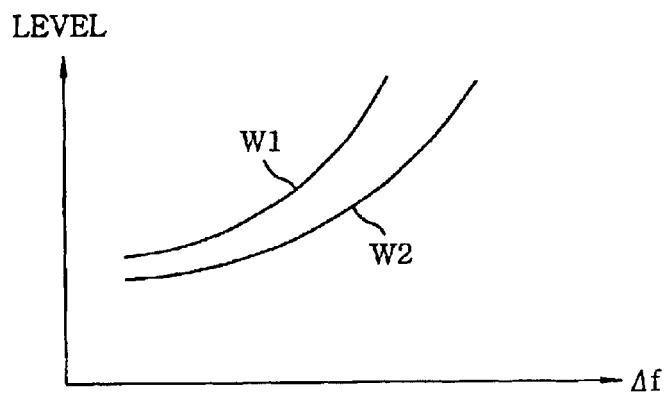
FIG. 12 shows a graph for illustrating level characteristics of the upper and the lower side third-order distortion components as a function of the difference frequency $\Delta f=(f2-f1)$ between two signals.
Figure 13A:
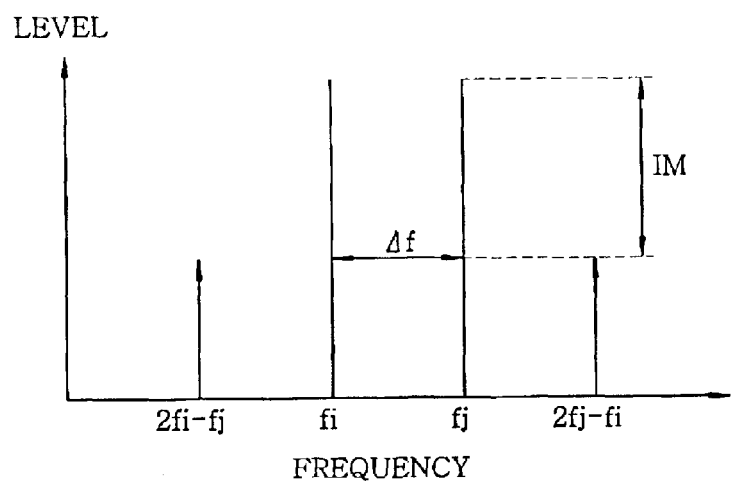
FIGS. 13A and 13B exemplarily illustrate the difference IM between the intensity levels of main signals and third-order distortion components thereof and the relationship between IM and the frequency difference of the main signals.
Figure 13B:
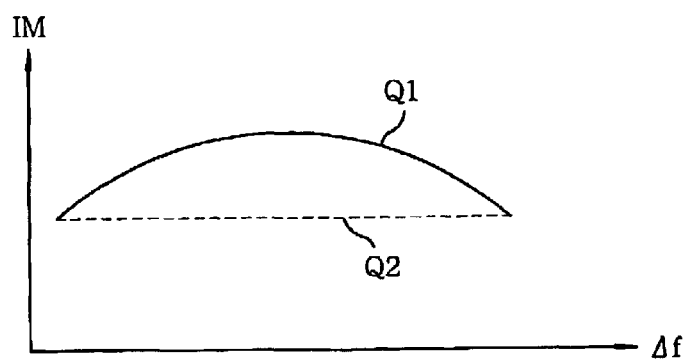
Figure 14:
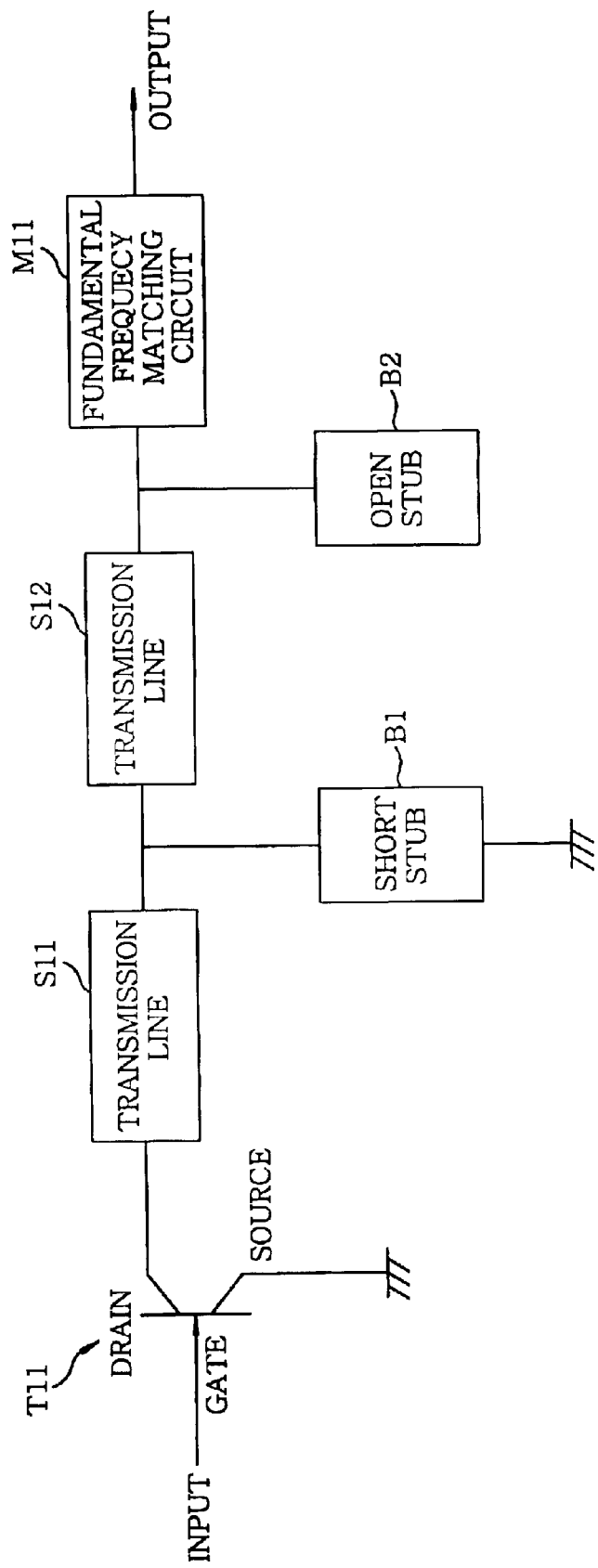
FIG. 14 shows a diagram of a prior art amplification circuit.
Figure 15:
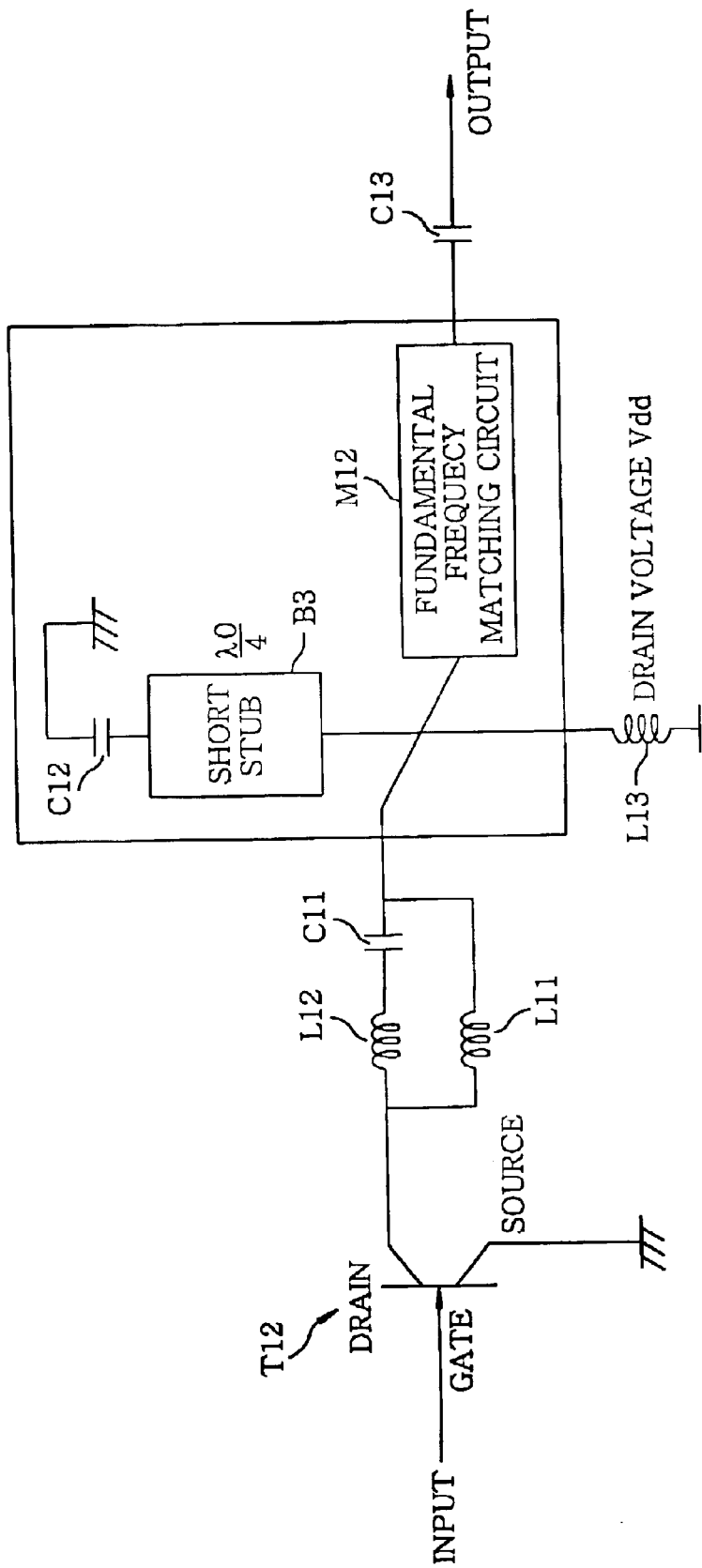
FIG. 15 shows a diagram of another prior art amplification circuit.
Figure 16:
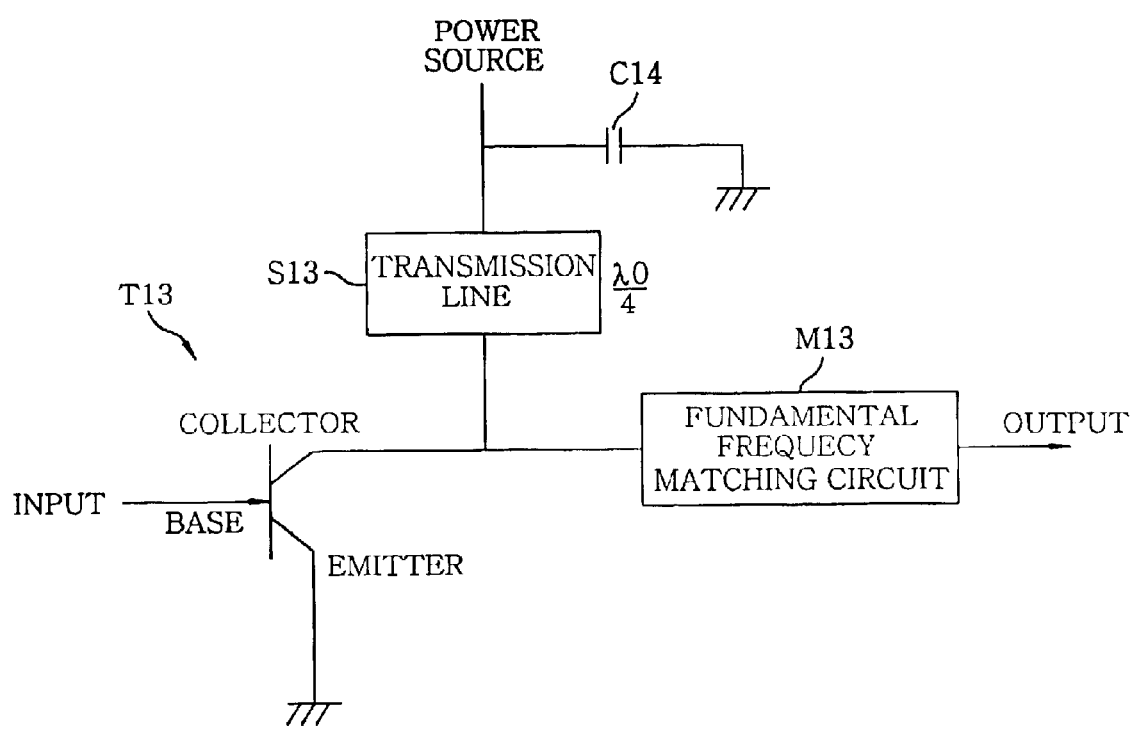
FIG. 16 shows a diagram of still another prior art amplification circuit.

A distortion reducing circuit in accordance with the present invention can be realized by combining an amplification unit to be described hereinbelow with a main amplifier 5 installed in the feed forward type amplification apparatus shown in FIG. 6, the main amplifier 12 installed in the pre-distortion type amplification apparatus shown in FIG. 7 or the main amplifier 28 shown in FIG. 8.

First, an amplification unit in accordance of a first preferred embodiment of the present invention will be described.

Figure 1:
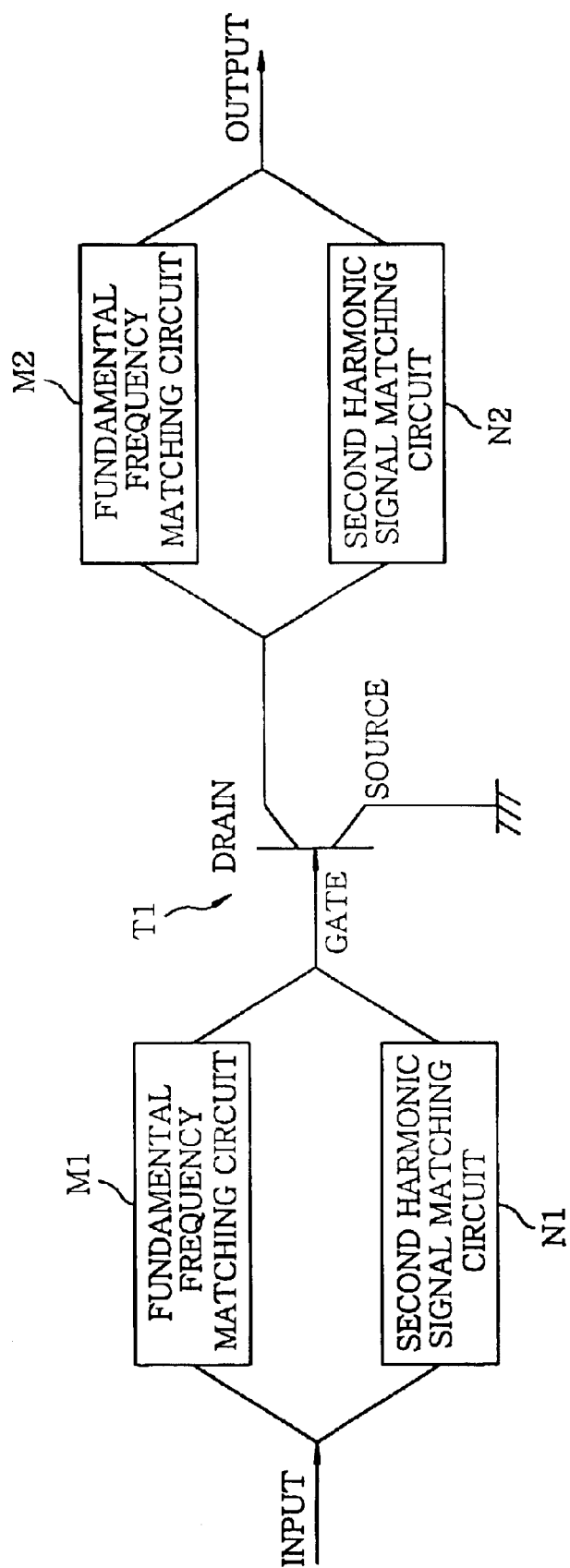
FIG. 1 shows a block diagram of an amplification unit including a matching circuit in accordance with a first preferred embodiment of the present invention.

FIG. 1 shows a block diagram of the amplification unit in accordance with the first preferred embodiment of the present invention, which includes a transistor T1 serving as a main amplifier. The transistor T1 shown in FIG. 1 is merely a symbolic representation of a main amplifier. Thus, it may not be constructed as a single transistor. It can be, e.g., one of the main amplifiers 5, 12 and 28 shown in FIGS. 6 to 8. This also holds for other transistors shown in FIGS. 2–5B. In the transistor T1, a fundamental frequency matching circuit M1 and a second harmonic signal matching circuit N1 are connected to a gate thereof in parallel, to thereby form an input terminal of the amplification unit. A source of the transistor T1 is grounded. A fundamental frequency matching circuit M2 and a second harmonic signal matching circuit N2 are connected to a drain of the transistor T1 in parallel as an output terminal of the amplification unit.

The fundamental frequency matching circuits M1 and M2 of the input and the output terminal may be implemented by, for example, band pass filters and function to perform a matching for the whole frequencies included in a fundamental signal inputted to the transistor T1 for the amplification thereof.

Similarly, the second harmonic signal matching circuits N1 and N2 of the input and the output terminal may also be constructed by, for example, band pass filters and serve to perform a matching for the whole frequencies included in a second harmonic signal of the fundamental signal.

In such an amplification unit, a fundamental signal including multiple frequency components is inputted to the gate of the transistor T1 via the fundamental frequency matching circuit M1 and the second harmonic signal matching circuit N1; and an amplification result (an amplified signal) of the fundamental signal by the transistor T1 is outputted via the fundamental frequency matching circuit M2 and the second harmonic signal matching circuit N2. The fundamental signal inputted to the transistor T1 is matched by the fundamental frequency matching circuits M1 and M2 and the second harmonic signal produced by the transistor T1 is matched by the second harmonic signal matching circuits N1 and N2.

In the preferred embodiment of the present invention shown in FIG. 1, the fundamental frequency matching circuit M1 and the second harmonic signal matching circuit N1 are provided also at the input terminal of the transistor T1. A matching can be performed both for the input and the output signal, to thereby stabilize the operation of the amplification unit.

As described above, the amplification unit installed in the distortion reducing circuit in accordance with the first preferred embodiment of the present invention performs the matching of a load impedance with respect to the second harmonic signal as well. Accordingly, the upper and the lower side third-order distortion components produced by the transistor T1 due to presence of the second harmonic signal can be removed or reduced irrespective of frequencies included in the fundamental signal.

The distortion compensation apparatus in accordance with the first preferred embodiment of the present invention includes the transistor T1 functioning as the amplifier (main amplifier), the output of which is a subject of the third-order distortion compensation. The second harmonic signal matching circuit N2 regulates reflection coefficients for the multiple frequency components included in the second harmonic signal to have a constant value approximating zero. Such second harmonic signal matching circuit serves as a second harmonic reflection coefficient regulation circuit in this embodiment. For the sake of simplicity, the amplifier is represented by only one transistor T1 in the embodiment shown in FIG. 1. However, it is also possible to use an amplifier including a plurality of transistors instead of the transistor T1.

Figure 2:
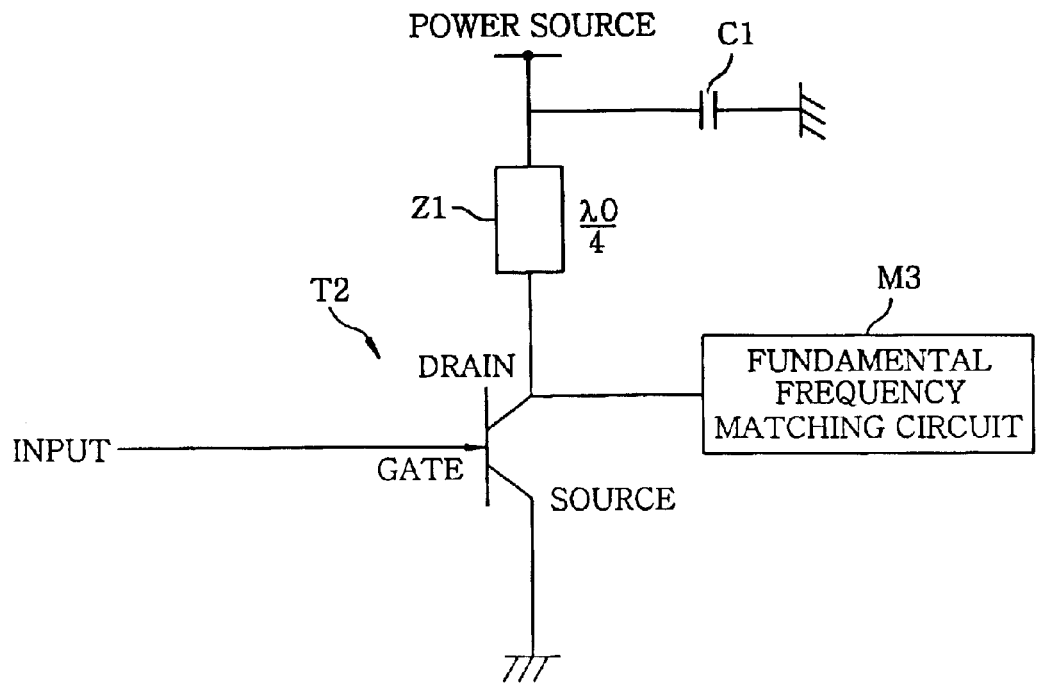
FIG. 2 describes a circuit diagram of an amplification unit with a second harmonic reflection coefficient of −1 in accordance with a second preferred embodiment of the present invention.

Referring to FIG. 2, there is illustrated a circuit diagram of an amplification unit in accordance with a second preferred embodiment of the present invention, which includes a transistor T2 functioning as a main amplifier. A gate of the transistor T2 serves as an input terminal of the amplification unit and a source of the transistor T2 is grounded. An input terminal of a fundamental frequency matching circuit M3 and one end of a transmission line (a choke coil) Z1 are connected to a drain of the transistor T2 in parallel. An output terminal of the fundamental frequency matching circuit M3 functions as an output terminal of the amplification unit. A power source and one end of a capacitor (a bypass capacitor) C1 are connected to the other end of the transmission line Z1 in parallel and the other end of the capacitor C1 is grounded.

The fundamental frequency matching circuit M3 can be implemented by, for example, a band pass filter and can perform a matching for the whole frequencies included in a fundamental signal inputted to the transistor T2.

The transmission line Z1 and the capacitor C1 constitute a second harmonic signal short circuit, wherein one end of the transmission line Z1 is shorted to the ground through the capacitor C1. The transmission line includes multiple transmission elements, each having a length of ¼ of wavelength $\lambda_0$ (i.e., $\lambda_0/4$) of one of the multiple frequency components included in the fundamental signal, which in turn corresponds to ½ of wavelength of one of the multiple frequency components included in the second harmonic signal. Therefore, the transmission line Z1 when viewed from the drain of the transistor T2, functions as an open circuit for the fundamental signal and a short circuit for the second harmonic signal.

The amplification unit provided in the distortion reducing circuit of the present embodiment regulates a load impedance coupled to the output terminal of the transistor T2, such that reflection coefficients of the frequency components included in the second harmonic signal become equal to −1 regardless of the frequencies included in the second harmonic signal. Therefore, the upper side and the lower side third-order distortion components produced by the transistor T2 owing to the second harmonic signal can be made to have a uniform level, independent of various frequencies in the fundamental frequency.

Also, since a short circuit (a second harmonic signal short circuit) is directly coupled to the drain of the transistor T2, a length of the transmission line between the drain and the short circuit can be approximated to zero. Accordingly, the amount of phase shift for any individual frequency component is reduced to virtually zero and therefore the reflection coefficients for the components of the second harmonic signal can be regulated to have a substantially identical value irrespective of frequencies.

Such configuration, shorting a second harmonic signal, can be readily practiced and facilitates the control of the reflection coefficients of the second harmonic signal. Since the second harmonic signal is totally reflected in this configuration, amplitudes of the reflected wave become higher. However, amplitudes and phases of the frequency components included in the reflected wave are respectively maintained to have uniform values independent of frequencies. Therefore, when employing such configuration in a distortion compensation apparatus using the pre-distortion scheme, highly effective distortion compensation can be carried out over a wide band in high degree of precision.

The distortion compensation apparatus of the present invention includes the transistor T2 functioning as the amplifier (main amplifier), the output of which is a subject of the third-order distortion compensation. The circuit including the transmission line Z1 and the capacitor C1 corresponds to the second harmonic signal short circuit, which regulates reflection coefficients for the multiple frequency components included in the second harmonic signal to have a value approximating −1. The second harmonic signal short circuit serves as a second harmonic reflection coefficient regulation circuit in this embodiment. For the convenience of explanation, the amplifier is represented by only one transistor T2 in the present embodiment. However, it is also possible to use an amplifier including a plurality of transistors, in lieu of the transistor T2.

Figure 3:
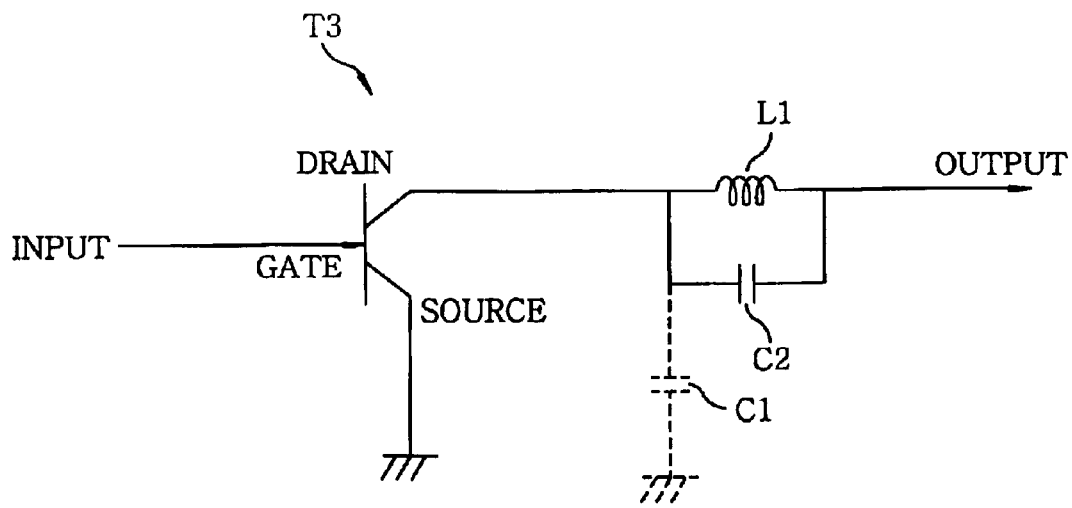
FIG. 3 depicts a circuit diagram of an amplification unit with a second harmonic reflection coefficient of +1.

It is possible to configure an amplification unit, which opens to the second harmonic signal to thereby regulate the reflection coefficients for the whole frequency components included in the second harmonic signal to a constant value of +1, as shown in FIG. 3. In the amplification unit shown in FIG. 3, a gate of a transistor T3 configuring a main amplifier is an input terminal of the amplification unit and a source of the transistor T3 is grounded. A second harmonic signal resonance circuit including an inductor L1 and a capacitor C2 is connected to a drain of the transistor T3, which form an output terminal of the amplification unit.

Because impedance is high in this configuration, it should be considered that such configuration can be liable to be affected by a stray capacitance Cf represented as a dashed line in the drawing.

Next, an amplification unit in accordance with a third embodiment of the present invention will be described.

Figure 4A:
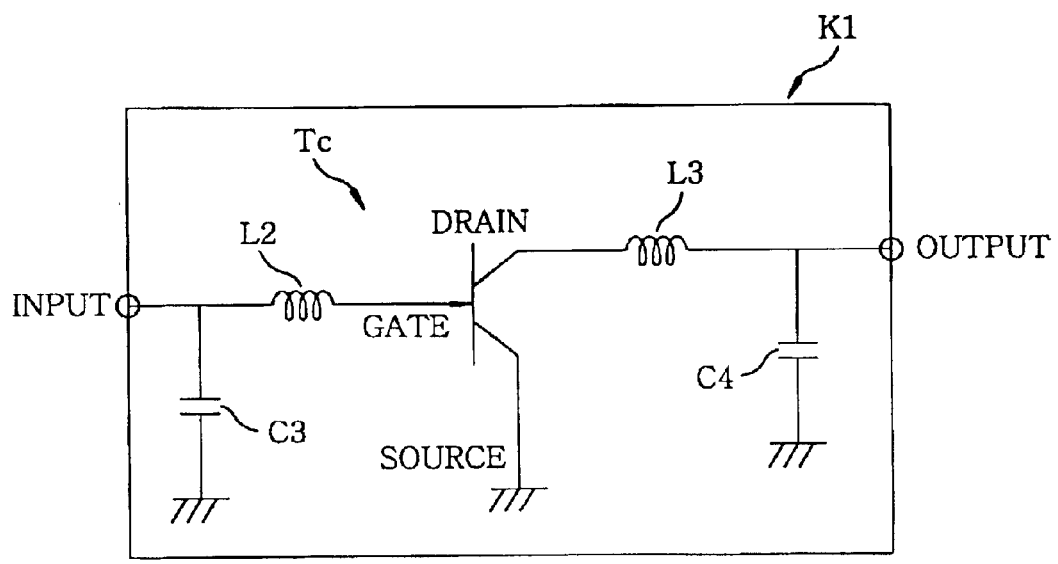
FIGS. 4A and 4B are circuit diagrams of an internal matching type transistor having a second harmonic reflector in accordance with a third preferred embodiment of the present invention.

FIG. 4A is a circuit diagram of an internal matching type transistor serving as the amplification unit in accordance with the third preferred embodiment of the present invention, which is equipped with a transistor case K1. An input terminal of the transistor case K1 is internally connected to an inductor L2 and a capacitor C3 in parallel. Also, the inductor L2 is connected to a gate of a transistor chip Tc and the capacitor C3 is grounded.

A source of the transistor chip Tc is grounded and a drain of the transistor chip Tc is connected to an output terminal of the transistor case K1 and a capacitor C4 in parallel via an inductor L3. The capacitor C4 is also grounded. In such internal matching type transistor, since the impedance of the transistor chip Tc decreases as the output power increases, a matching circuit including the inductors L2 and L3 is installed within the transistor case K1 to increase the impedance.

Figure 4B:
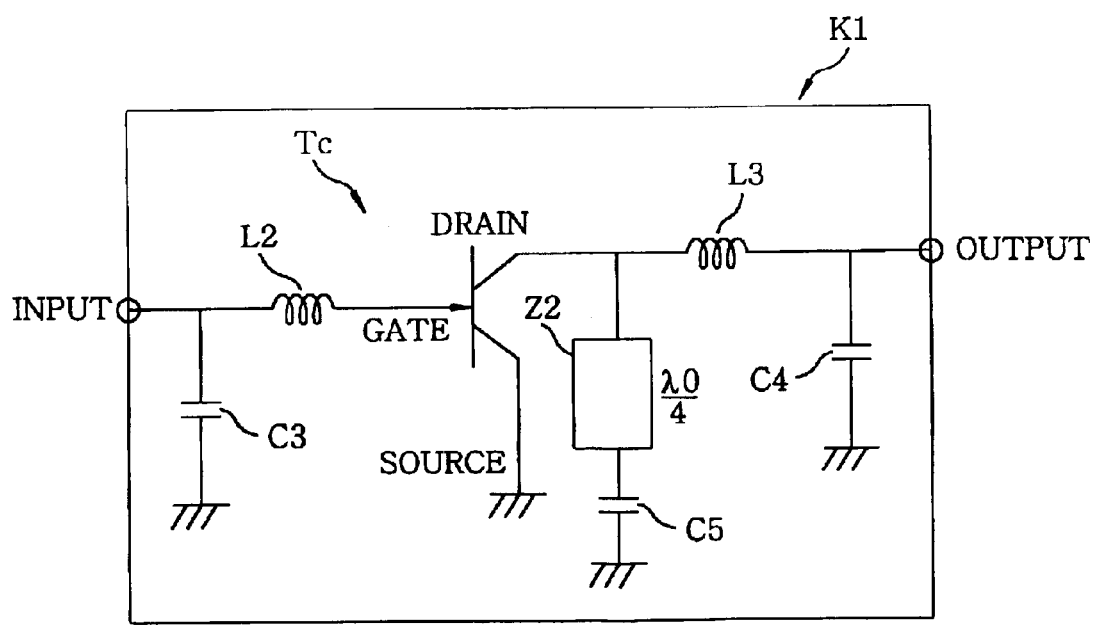
Figure 5A:
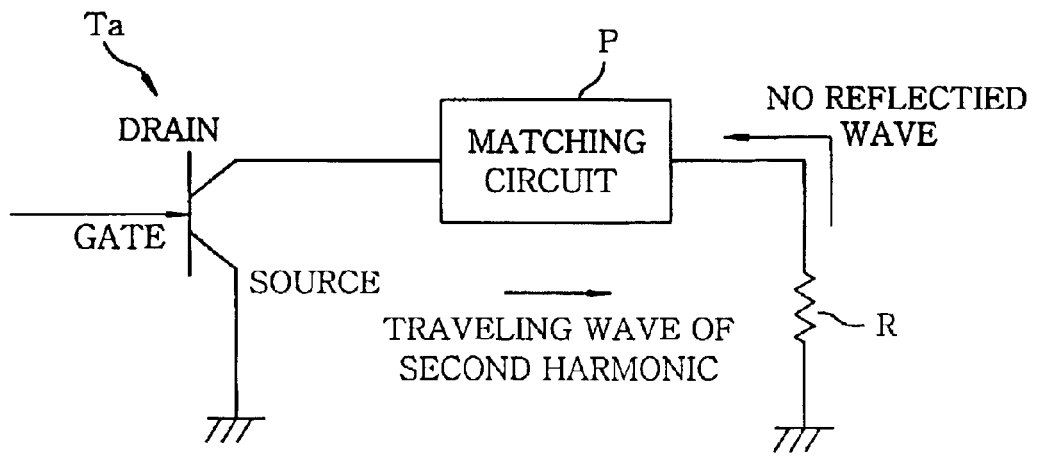
FIGS. 5A and 5B represent circuit diagrams for illustrating a matching and a total reflection of a second harmonic.
Figure 5B:
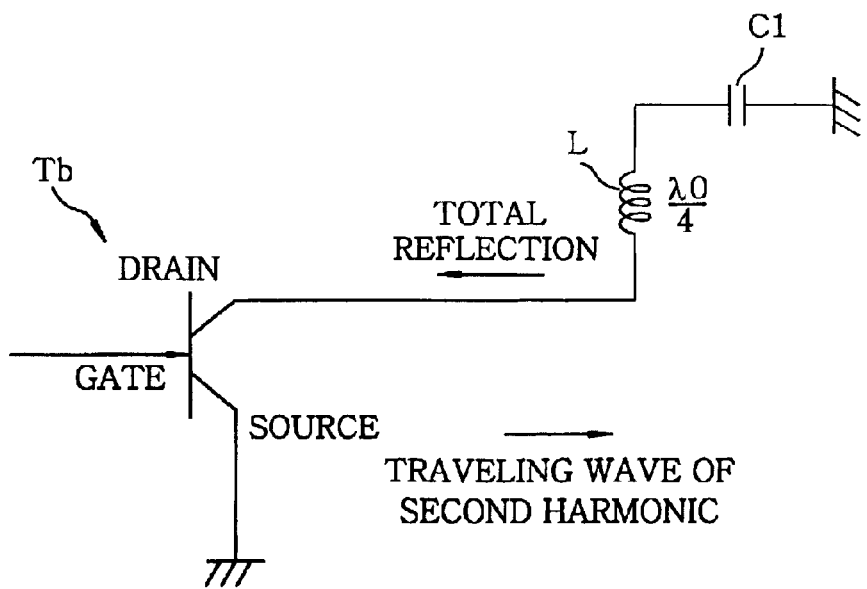

FIG. 4B is a circuit diagram of an amplification unit of the present invention, wherein a second harmonic signal reflector is installed in the transistor case K1 of the internal matching type transistor shown in FIG. 4A. The second harmonic signal reflector includes a transmission line Z2, whose length is ¼ of wavelength $\lambda_0$ of a fundamental signal, and a DC blocking capacitor C5 connected in series. One end of the second harmonic signal reflector is connected to a node between the transistor chip Tc and the inductor L3, while the other end thereof is grounded. This configuration can realize a high impedance (open) for the fundamental signal and short for the second harmonic signal. For example, the configuration regulates the reflection coefficients for all the frequency components of the second harmonic signal to have a constant value of −1 irrespective of frequencies.

The amplification unit provided in the distortion reducing circuit in accordance with the present embodiment regulates a load impedance coupled to the output terminal of the transistor chip Tc, such that reflection coefficients for all the frequency components included in the second harmonic signal become equal to −1 irrespective of frequencies included in the second harmonic signal. Accordingly, all the upper side and the lower side third-order distortion components produced by the transistor chip Tc owing to the second harmonic signal can be regulated to have a same level irrespective of difference frequencies of the fundamental signal.

A bonding wire can be commonly used as the inductor L3 and such bonding wire may cause a phase shift in the second harmonic signal. Therefore, it is preferable to install the second harmonic signal reflector having the transmission line Z2 and the blocking capacitor C5 right behind the transistor chip Tc in the internal matching type transistor. The second harmonic signal reflector may be implemented by a resonance circuit having serially connected inductor and capacitor.

In the distortion reducing circuit of the present embodiment, the amplifier (main amplifier), the output of which is subjected to the third-order distortion compensation, is implemented by using the internal matching type transistor (the transistor chip Tc). The circuit (the second harmonic signal reflector) including the transmission line Z2 and the capacitor C5 corresponds to the second harmonic signal short circuit which regulates reflection coefficients for multiple frequency components included in the second harmonic signal to have a constant value of −1. The second harmonic signal short circuit serves as a second harmonic reflection coefficient regulation circuit. Further, the distortion reducing circuit of the present embodiment is equipped with the transistor chip Tc and the second harmonic signal short circuit in the transistor case K1. For the convenience of explanation, only one transistor chip Tc is depicted in the drawing. However, a plurality of parallel coupled transistor chips can be used instead, to increase outputs.

It is to be understood that the distortion reducing circuit in accordance with the present invention can be implemented by configuration other than those described above with respect to the preferred embodiments.

Further, it is to be noted that the present invention can be used in other application fields than those described above in the preferred embodiments.

Further, it is also to be noted that the reflection coefficients provided by a second harmonic signal matching circuit of the invention can be made to have, for all the frequency components included in the second harmonic signal, a same value approximating or being equal to zero.

Also, reflection coefficients produced by a second harmonic signal short circuit of the invention can be of a value equal to or close to −1 for all multiple frequency components included in a second harmonic signal.

As an example, the distortion reducing circuit in accordance with the present invention can be equipped in a transmitter of a base station of a mobile communications system in order to carry out compensation of upper and lower side third-order distortions produced by an amplifier of the transmitter for amplifying, e.g., a W-CDMA multi carrier signal (fundamental signal) to be wirelessly transmitted by the transmitter to mobile stations. Further, the distortion reducing circuit in accordance with the present invention can also be employed in a relay station apparatus (or relay amplification apparatus) of such mobile communications system.

While the invention has been shown and described with respect to the preferred embodiments, it will be understood by those skilled in the art that various changes and modifications may be made without departing from the spirit and scope of the invention as defined in the following claims.

What is claimed is:

1. A distortion reducing circuit, comprising:

means for compensating an upper side third-order distortion and a lower side third-order distortion produced by an amplifier for amplifying a fundamental signal including multiple frequency components; and a second harmonic reflection coefficient regulation circuit, installed at an output side of the amplifier, for regulating reflection coefficients for multiple frequency components included in a second harmonic signal to have a constant value.

2. A distortion reducing circuit for regulating an upper side and a lower side third-order distortion produced by an amplifier for amplifying a fundamental signal including multiple frequency components, comprising:

a transistor functioning as the amplifier; and an input and an output stage, wherein the input stage includes a fundamental frequency matching circuit and a second harmonic signal matching circuit connected in parallel to a gate of the transistor, the fundamental signal being commonly supplied to the matching circuits as an input thereof; and the output stage includes another fundamental frequency matching circuit and another second harmonic signal matching circuit connected in parallel to a drain of the transistor, output terminals of said another matching circuits being connected to a common node serving as an output terminal of the distortion reducing circuit, to thereby allow a level of the upper side third-order distortion and that of the lower side third-order distortion to be regulated to be substantially identical to each other.

3. A distortion reducing circuit for regulating an upper side and a lower side third-order distortion produced by an amplifier for amplifying a fundamental signal including multiple frequency components, comprising:

a transistor functioning as the amplifier and having a gate to which the fundamental signal is directly supplied and a grounded source; and a fundamental frequency matching circuit and a transmission line which are commonly connected to a drain of the transistor, an output terminal of the fundamental frequency matching circuit serving as an output terminal of the distortion reducing circuit, wherein reflection coefficients of a plurality of frequency components included in a second harmonic signal become equal to −1.

* * * * *